United States Patent
Ohtani et al.

(10) Patent No.: US 12,388,406 B2
(45) Date of Patent: Aug. 12, 2025

(54) ACOUSTIC APPARATUS

(71) Applicant: Yamaha Corporation, Hamamatsu (JP)

(72) Inventors: Yohei Ohtani, Iwata (JP); Masao Noro, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 397 days.

(21) Appl. No.: 17/945,751

(22) Filed: Sep. 15, 2022

(65) Prior Publication Data

US 2023/0017817 A1 Jan. 19, 2023

Related U.S. Application Data

(63) Continuation of application No. PCT/JP2021/008461, filed on Mar. 4, 2021.

(30) Foreign Application Priority Data

Mar. 16, 2020 (JP) ................. 2020-045317

(51) Int. Cl.
 *H03F 3/217* (2006.01)
 *H03F 1/34* (2006.01)
 *H04R 3/00* (2006.01)

(52) U.S. Cl.
 CPC ............ *H03F 3/217* (2013.01); *H03F 1/34* (2013.01); *H04R 3/002* (2013.01);
 (Continued)

(58) Field of Classification Search
 CPC ........ H03F 3/217; H03F 1/34; H03F 2200/03; H03F 2200/153; H03F 2200/351;
 (Continued)

(56) References Cited

U.S. PATENT DOCUMENTS 9,680,432 B2 * 6/2017 Otani ................ H04R 3/00
2016/0020735 A1 1/2016 Otani et al.

FOREIGN PATENT DOCUMENTS

| CN | 105281684 A | 1/2016 |
|---|---|---|
| JP | 2016-25475 A | 2/2016 |
| JP | 6210027 B2 | 10/2017 |

OTHER PUBLICATIONS

International Search Report (PCT/ISA/210) issued in PCT Application No. PCT/JP2021/008461 dated Jun. 1, 2021 with English translation (five (5) pages).
(Continued)

*Primary Examiner* — Hieu P Nguyen
(74) *Attorney, Agent, or Firm* — Crowell & Moring LLP (57) ABSTRACT

An acoustic apparatus includes a class-D amplifier including a current feedback circuit, and a speaker system including a voice coil driven by the class-D amplifier. The speaker system is configured such that, in a case where the speaker system is driven by an ordinary amplifier having a first output resistance lower than a second output impedance of the class-D amplifier, a Q factor of the speaker system falls below a predetermined lower limit of an ordinary Q factor range of an ordinary speaker system. The current feedback circuit is configured to increase the second output impedance of the class-D amplifier by feeding a current flowing to the voice coil back to an input of the class-D amplifier so as to increase a Q factor as the acoustic apparatus higher than the predetermined lower limit of the ordinary Q factor range and within the ordinary Q factor range.

9 Claims, 2 Drawing Sheets

(52) U.S. Cl.
CPC .... *H03F 2200/03* (2013.01); *H03F 2200/153* (2013.01); *H03F 2200/351* (2013.01)

(58) Field of Classification Search
CPC ....... H03F 3/183; H03F 3/2171; H04R 3/002; H04R 9/06; H04R 3/08
USPC ........................................ 330/10, 207 A, 251
See application file for complete search history.

(56) References Cited

OTHER PUBLICATIONS

Japanese-language Written Opinion (PCT/ISA/237) issued in PCT Application No. PCT/JP2021/008461 dated Jun. 1, 2021 (three (3) pages).
International Preliminary Report on Patentability (PCT/IB/338 & PCT/IB/373) issued in PCT Application No. PCT/JP2021/008461 dated Sep. 29, 2022, including Japanese-language Written Opinion (PCT/ISA/237) with English translation (eight (8) pages).
Japanese-language Office Action issued in Japanese Application No. 2020-045317 dated Aug. 28, 2024 with English translation (4 pages).
Japanese-language Office Action issued in Japanese Application No. 2020-045317 dated March 27, 2024 with English translation (5 pages).
Chinese-language Office Action issued in Chinese Application No. 202180019040.9 dated Nov. 29, 2024, with English translation (12 pages).

* cited by examiner

ACOUSTIC APPARATUS

CROSS REFERENCE TO RELATED APPLICATION

The present application is a continuation application of International Application No. PCT/JP2021/008461, filed on Mar. 4, 2021, which claims priority to Japanese Patent Application No. 2020-045317, filed on Mar. 16, 2020. The contents of these applications are incorporated herein in their entirety.

BACKGROUND

The following disclosure relates to an acoustic apparatus including an amplifier and a speaker system.

In a speaker system in which a speaker unit is provided for an enclosure, an efficiency η of the speaker system is an essential element. The efficiency η of the speaker system is a ratio between an output sound pressure of the speaker system and an electrical energy inputted to the speaker system, and the efficiency η is given by the following equation.

$$\eta = \rho * BL^2 * Sd^2 / (2\pi * M^2 * Rsp) \quad (1)$$

Here, ρ represents the density of air as a medium of sound. BL represents a force factor of the speaker unit in the speaker system, and BL is given by the product of a magnetic flux density of a magnetic gap provided in the speaker unit and a coil length of a voice coil disposed in the magnetic gap. Moreover, Sd represents a radius of a diaphragm that outputs sound by the movement of the voice coil in the speaker unit. M represents a mass in a vibration system of the speaker unit. Rsp represents a resistance of the voice coil.

Moreover, there is a resonance of sharpness Q factor (i.e. Quality Factor) as another element regarding performance of a speaker system. In a case where the lowest resonant frequency of the speaker system is F0, the Q factor of the speaker system is given by the following equation.

$$Q = 2\pi * F0 * M * Rsp / BL^2 \quad (2)$$

Here, the Q factor of the speaker system is easily calculated by a direct current resistance of the speaker unit and a impedance curve of the speaker unit, and so on, which are measured by a conventional TS parameter determining method. The equation (2) exactly represents an electrical system's Qes, however, since the Q factor of the speaker system normally becomes a value close to a combined Q factor which is combined by the electrical system's Qes and the mechanical system's Qms, the combined Q factor is considered as the Q factor of the speaker system.

SUMMARY

According to the equations (1) and (2), in a case where the parameters are adjusted, such as the mass M is increased, the force factor BL is increased, or the resistance Rsp is decreased, the Q factor becomes smaller and the efficiency η becomes larger. That is, in the speaker system, the efficiency η can be improved and the electric power consumption can be decreased by adjusting the parameters so that the Q factor is decreased. When adjusting the parameters in which the Q factor is decreased, the efficiency η is improved at the mid-high frequency range, however, the efficiency η is decreased around the lowest resonant frequency F0 when the sound pressure is decreased due to decrease of the Q factor. In the conventional acoustic apparatus, it is difficult to improve the efficiency η of the acoustic apparatus including an amplifier over the whole frequency range including the lowest resonant frequency F0.

An aspect of the disclosure relates to an acoustic apparatus capable of improving an efficiency η of the whole acoustic apparatus including an amplifier over the whole frequency range including the lowest resonant frequency F0.

In one aspect of the disclosure, an acoustic apparatus includes a class-D amplifier including a current feedback circuit, and a speaker system including a voice coil driven by the class-D amplifier. The speaker system is configured such that, in a case where the speaker system is driven by an ordinary amplifier having a first output resistance lower than a second output impedance of the class-D amplifier, a Q factor of the speaker system falls below a predetermined lower limit of an ordinary Q factor range of an ordinary speaker system. The current feedback circuit is configured to increase the second output impedance of the class-D amplifier by feeding a current flowing to the voice coil back to an input of the class-D amplifier so as to increase a Q factor as the acoustic apparatus higher than the predetermined lower limit of the ordinary Q factor range and within the ordinary Q factor range.

BRIEF DESCRIPTION OF THE DRAWINGS

The objects, features, advantages, and technical and industrial significance of the present disclosure will be better understood by reading the following detailed description of the embodiments, when considered in connection with the accompanying drawings, in which.

DETAILED DESCRIPTION

There will be described embodiments of this disclosure with reference to FIGS. 1 to 4.

Figure 1:
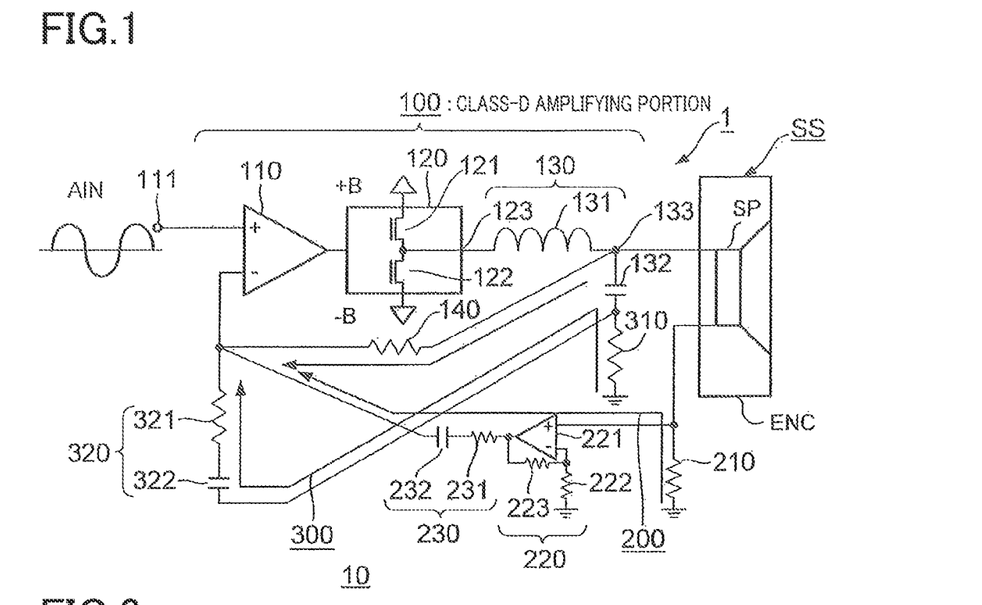
FIG. 1 is a schematic circuit diagram illustrating an embodiment of an acoustic apparatus.

FIG. 1 is a schematic circuit diagram illustrating a configuration of an acoustic apparatus 10. As illustrated in FIG. 1, the acoustic apparatus 10 includes a class-D amplifier 1 and a speaker system SS. The class-D amplifier 1 includes a class-D amplifying portion 100, a current feedback circuit 200 and a filter current feedback circuit 300. Moreover, the speaker system SS includes a speaker unit SP driven by the class-D amplifier 1 and an enclosure ENC in which the speaker unit SP is provided. It is noted that the class-D amplifier including the current feedback circuit and the filter current feedback circuit is disclosed in Japanese Patent No. 6210027, for instance. Any variation of the class-D amplifier disclosed in the Japanese Patent No. 6210027 is applicable to the embodiments of this disclosure.

Figure 2:
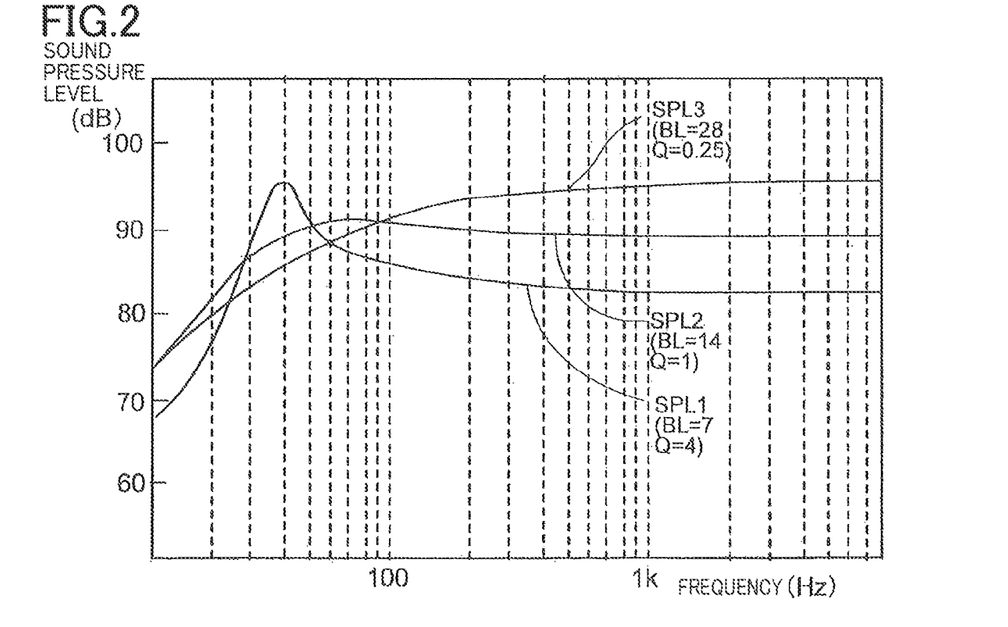
FIG. 2 is a diagram illustrating frequency characteristics of an output sound pressure of a speaker system.

Here, there will be described characteristics of the speaker system SS connected to the class-D amplifier 1 with reference to FIG. 2. In FIG. 2, a horizontal axis of a graph represents frequency of a sine wave with a predetermined amplitude given to the speaker system SS. A vertical axis of the graph represents outputted sound pressure level at a position spaced apart from the speaker system SS by a predetermined distance. In FIG. 2, frequency characteristics SPL1 of the sound pressure level of the speaker system SS whose force factor BL is 7, frequency characteristics SPL2 of the sound pressure level of the speaker system SS whose force factor BL is 14, and frequency characteristics SPL3 of the sound pressure level of the speaker system SS whose force factor BL is 28 are illustrated. As illustrated in FIG. 2, the sound pressure level in the mid-high frequency range becomes higher as the force factor BL becomes larger. However, the sound pressure level in the low frequency range around the lowest resonant frequency F0=40 Hz does not become higher even when the force factor BL becomes larger. In a case where the force factor BL is too large, the Q factor of the speaker system SS becomes lower, and the excessive force factor BL makes the efficiency η of the speaker system SS in the low frequency range lower. In the embodiment illustrated in FIG. 2, when the force factor BL increases in this order; 7, 14 and 28, the Q factor decreases in this order; 4, 1 and 0.25.

In order to improve the efficiency η over the whole frequency range, it is preferable that the force factor BL becomes larger. However, in the case where the force factor BL is too large, the Q factor becomes lower. Accordingly, if any measures to prevent the decrease of Q factor are not taken, the level of the sound pressure outputted from the speaker system SS becomes lower in the low frequency range, especially around the lowest resonant frequency F0, and bass sounds become weak.

Accordingly, the following measures are taken in the present embodiment.

(a) A lower limit value of an ordinary Q factor range for the acoustic apparatus 10 is typically determined to be 0.2. The lower limit value of the ordinary Q factor range is heuristically determined based on an experiment where a plurality of speaker systems having different Q factors are experimentally made and relationships of the Q factors against frequency characteristics of the output sound pressure of the plurality of speaker systems are investigated. The predetermined lower limit may be larger or smaller than the value 0.2. The ordinary Q factor range is defined as a range that, if the Q factor of an ordinary speaker system falls in the range, then the ordinary speaker system will emit sound pressure at low frequency range proportionate to its sound pressure in mid-high frequency range. If the Q factor of a speaker system is too high, the sound pressure level of the speaker system around the lowest resonant frequency F0 becomes too large. Accordingly, there should be the upper limit of the ordinary Q factor range. However, the high Q factor causes lowering the efficiency η and there is no further discussion about the upper limit of the ordinary Q factor range in the present disclosure because to improve the efficiency η is the main purpose here.

(b) The speaker unit SP having a force factor BL such high that the Q factor of the speaker system SS using the speaker unit SP in a case of being driven by an ordinary amplifier whose output impedance (output resistance) is nearly zero falls below the lower limit value of the ordinary Q factor range is specially produced.

More specifically, the speaker unit SP whose Q factor is lower than the lower limit value of the ordinary Q factor range is manufactured by increasing magnetic flux density of the magnetic gap or using the voice coil with a conducting wire whose resistance per unit length is lower than an ordinary wire for an ordinary speaker unit, and the produced speaker unit SP is used to construct the speaker system SS. In a case where the speaker system SS is driven by the ordinary amplifier whose output impedance is nearly zero, the efficiency η in high frequency range away from the lowest resonant frequency F0 is improved, however, the efficiency η in low frequency range around the lowest resonant frequency F0 decreases due to too much driving force, and sound pressure in low frequency range becomes insufficient compared to sound volume at in mid-high frequency range.

It is noted that the ordinary amplifier whose output impedance is nearly zero is an example of a commonly available amplifier. The ordinary amplifier is a mainstream power amplifier which is readily available on the audio market. Damping factors of most of the mainstream power amplifiers are within a range from a few dozen to a few hundred. The output impedances of the most of mainstream power amplifiers calculated from the damping factors are less than 0.5 ohm. That is, the ordinary amplifier commonly has output impedance less than 0.5 ohm or, in other word, nearly zero.

An ordinary acoustic apparatus is constituted by combining the ordinary amplifier with an ordinary speaker system. The ordinary speaker system is a mainstream speaker system which is commercially available on the audio market, and the ordinary speaker system is designed on the premise that the ordinary speaker system is driven by the ordinary amplifier. Specifically, the ordinary speaker system is tuned such that, when the speaker system is driven by the ordinary amplifier, the output sound pressure of the ordinary speaker system has flat frequency characteristics and well-balanced over a whole frequency range including low, mid, and high frequency ranges. In the condition, the ordinary speaker system is designed such that the Q factor falls within the ordinary Q factor range in a case where the ordinary speaker system is driven by the ordinary amplifier. On the other hand, in the speaker system SS in the present disclosure, the speaker system SP is designed to have the force factor BL higher than force factor of the ordinary speaker unit of the ordinary speaker system. Accordingly, the speaker system SS in the present disclosure has the Q factor of the speaker system SS, in a case where being driven by the ordinary amplifier, being lower than the lower limit of the ordinary Q factor range.

(c) The output impedance of the class-D amplifier 1 is controlled by a current feedback by the current feedback circuit 200, such that the Q factor of the acoustic apparatus 10 is increased to fall within the ordinary Q factor range.

Specifically, the Q factor of the acoustic apparatus 10 including the class-D amplifier 1 and the speaker system SS is given by the following equation.

$$Q = 2\pi * F0 * M * (Rsp + Ramp)/BL^2 \qquad (3)$$

In the equation (3), Rsp represents a resistance of the voice coil and Ramp represents an output resistance (output impedance) of an amplifier that drives the speaker unit SP. The speaker system SS of the present embodiment is designed such that the Q factor of the speaker system SS calculated by the equation (2) becomes lower than the predetermined lower limit value 0.2 of the ordinary Q factor range in a case where the speaker system SS is driven by the ordinary amplifier (Ramp is approximately equal to zero). In the present embodiment, the Q factor of the acoustic apparatus calculated by the equation (3) is increased to a value within the ordinary Q factor range by controlling the output resistance Ramp of the class-D amplifier 1 by way of the current feedback by the current feedback circuit 200.

As described above, in the conventional design method in which only the parameters of the speaker system SS are adjustable, it is hard to improve the efficiency η of the acoustic apparatus 10 over the whole audible frequency range including the lowest resonant frequency F0. On the other hand, the efficiency η of the acoustic apparatus 10 relates to not only the electric power consumption of the speaker system SS but also the electric power consumption of the output resistance Ramp of the class-D amplifier 1. As shown by the equation (3), the output resistance Ramp of the class-D amplifier 1 increases the Q factor of the acoustic apparatus 10 to a value within the ordinary Q factor range. While the output resistance Ramp is an imaginary resistance based on current feedback, so the output resistance Ramp of the class-D amplifier 1 does not consume electric power. As a result, in the present embodiment, the Q factor of the acoustic apparatus 10 including the speaker system SS with high force factor BL within the ordinary Q factor range without increasing the electric power consumption. Accordingly, the efficiency η of the acoustic apparatus 10 over the whole frequency range including the lowest resonant frequency F0 can be improved.

In FIG. 1, the D-class amplifying circuit 100 includes an operational amplifier 110, an output stage 120, a filter 130 and a feedback resistor 140. The operational amplifier 110 may be a comparator. The operational amplifier 110 is a circuit that amplifies a difference between a non-inverting input and an inverting input, and the operational amplifier 110 functions as an input portion of the D-class amplifying circuit 100 with respect to input signals. An input audio signal AIN is inputted to the non-inverting input of the operational amplifier 110 via an input terminal 111.

The output stage 120 is a circuit that amplifies output signals, as electric power, of the operational amplifier 110. The output stage 120 incudes, as a switching element, a transistor 121 disposed between a positive power supply +B and an output terminal 123 of the output stage 120, and a transistor 122 disposed between a negative power transistor −B and the output terminal 123 of the output stage 120. It is preferable that the transistors 121 and 122 are high-efficiency and high-speed switching elements such as MOSFET (Metal Oxide Semiconductor Field Effect Transistor). The output stage 120 sets the transistor 121 to ON and sets the transistor 122 to OFF based on the output signal of the operational amplifier 110 (i.e., a PWM pulse train) such that the positive power supply +B is connected to the output terminal 123. Moreover, The output stage 120 sets the transistor 121 to OFF and sets the transistor 122 to ON based on the output signal of the operational amplifier 110 such that the negative power supply −B is connected to the output terminal 123. Accordingly, the output signal of the output stage 120 (i.e., the PWM pulse train being power amplified) becomes a rectangular wave.

The filter 130 is a low-pass filter that removes components above audible range from the power-amplified PWM signal and outputs a power-amplified audio signal of the remaining component in audible range to the speaker unit SP The filter 130 includes an inductor 131 and a capacitor 132. Here, the inductor 131 is disposed between the output terminal 123 of the output stage 120 and a first terminal of the speaker unit SP. A first terminal of the capacitor 132 is connected to a node 133 located between the inductor 131 and the first terminal of the speaker unit SP, and a second terminal of the capacitor 132 is grounded via a current sensing resistor 310 of the filter current feedback circuit 300. That is, the capacitor 132 is connected in parallel to the speaker unit SP as a load. It is noted that the filter current feedback circuit 300 will be described later.

The feedback resistor 140 is disposed between the node 133 located between the inductor 131 and the speaker unit SP and an inverting input terminal of the operational amplifier 110. The feedback resistor 140 constitutes a feedback loop that feeds the output voltage to the speaker unit SP back to the operational amplifier 110 as the input portion of the D-class amplifying circuit 100 and causes the self-oscillation of the D-class amplifying circuit 100. The D-class amplifying circuit 100 outputs, from the output stage 120, the PWM pulse train modulated by the pulse width modulation based on the input audio signal AIN while the D-class amplifying circuit 100 oscillates at a predetermined self-oscillation frequency and power amplified by the output stage 120. The filter 130 has functions of removing, from the power amplified PWM pulse train, components at and above the predetermined self-oscillation frequency and supplying the power amplified audio signal of the remaining components in audible range to the speaker unit SP. Above described elements constitutes the D-class amplifying circuit 100.

The current feedback circuit 200 and the filter current feedback circuit 300 are connected to the D-class amplifying circuit 100 in the class-D amplifier 1.

The current feedback circuit 200 is a circuit that negatively feeds, back to the operational amplifier 110 as the input portion, a load current flowing to the speaker unit SP which is a load of the D-class amplifying circuit 100. The current feedback circuit 200 includes a resistor 210, an amplifying portion 220 and a coupling portion 230.

The resistor 210 is disposed between a second terminal of the speaker unit SP which is an opposite to the node 133 and a ground line. The amplifying portion 220 is constituted by an operational amplifier 221 and resistors 222, 223. The inverting input terminal of the operational amplifier 221 is grounded via the resistor 222 and connected to an output terminal of the operational amplifier 221 via the resistor 223. Then, the voltage between terminals of the resistor 210 is given to a non-inverting input terminal of the operational amplifier 221. Accordingly, in a case where Ra represents a value of resistance of the resistor 222 and Rb represents a value of resistance of the resistor 223, the amplifying portion 220 amplifies the voltage between the terminals of the resistor 210 by a gain calculated by (Ra+Rb)/Ra, and the amplifying portion 220 outputs the amplified voltage. In the present embodiment, since the voltage between the terminals of the resistor 210 is amplified by the amplifying portion 220 so as to become a sufficient voltage, it is possible to lower the value of resistance of the resistor 210. The coupling portion 230 is constituted by a resistor 231 and a capacitor 232 each disposed in series between an output terminal of the amplifying portion 220 and an inverting input terminal of the operational amplifier 110. The coupling portion 230 has a function that adjusts frequency characteristics of an amount of feedback of the negative feedback performed through the current feedback circuit 200.

In the present embodiment, the current feedback circuit 200 executes a constant current driving control in which the current feedback circuit 200 controls the load current flowing to the speaker unit SP which is a load of the Class-D amplifying portion 100 to approach a current value which is proportional to the voltage of the input audio signal AIN. Moreover, in the constant current driving feedback, the current feedback circuit 200 adjusts the output impedance of the output stage 120 to a resistance value by which the Q factor of the acoustic apparatus 10 falls within the ordinary Q factor range. Specifically, in the equation (3), where Rsp represents a resistance of the voice coil of the speaker unit SP and Ramp represents an appropriate resistance of the output stage 120 by which the Q factor of the acoustic apparatus 10 falls within the ordinary Q factor range, the gain of the amplifying portion 220 of the current feedback circuit 200 is determined such that the output impedance of the output stage 120 becomes the appropriate resistance Ramp. Specifically, by experimentally increasing or decreasing the gain of the amplifying portion 220 of the current feedback circuit and the resistance value of the resistor 231, the amount of feedback of the load current (i.e., the voltage between the terminals of the resistor 210) is adjusted such that a ratio (i.e., Ramp) of a change amount of the load current of the load SP with respect to a change amount of the voltage of the node 133 in a case where the resistance Rsp of the load SP is changed becomes a value multiplying the resistance Rsp by k, where k is greater than 1 and equal to or less than 10. The gain and the resistance value may be determined by calculating characteristics of the circuit, or may be determined based on actual measured characteristics of the circuit. Here, the appropriate resistance Ramp is, for example, set to a value within a range from 1 ohm to 10 ohm.

The filter current feedback circuit 300 is a circuit that feeds the current flowing to the capacitor 132 of the filter 130, what is called a filter current, back to the operational amplifier 110 as the input portion of the Class-D amplifying portion 100, and the filter current feedback circuit 300 is constituted by the above described current sensing resistor 310 and a coupling portion 320. Here, the coupling portion 320 is constituted by a resistor 321 and a capacitor 322 which are disposed in series between a connecting node between the current sensing resistor 310 and the capacitor 132 and the inverting input terminal of the operational amplifier 110. The coupling portion 320 has a function that adjusts frequency characteristics of an amount of the negative feedback performed via the filter current feedback circuit 300. Above described elements constitutes the class-D amplifier 1.

Next, there will be described operations of the present embodiment. In the class-D amplifying portion 100, the output signal of the output stage 120 is fed back to the operational amplifier 110 as the input portion of the class-D amplifying portion 100 via the filter 130 and the feedback resistor 140. A phase of the output signal is rotated by the filter 130 and the feedback resistor 140. Accordingly, the class-D amplifying portion 100 self-oscillates at a self-oscillation frequency. The class-D amplifying portion 100 is designed such that the self-oscillation frequency of the class-D amplifying portion 100 is sufficiently higher than the frequency range of the input audio signal AIN. As described in Japanese Patent No. 6210027, it is possible to increase the self-oscillation frequency to a frequency above audible range by the function of the filter current feedback circuit 300. In addition, the filter current feedback circuit can be adequately omitted as described in the Japanese Patent No. 6210027.

Here, the output voltage of the output stage 120 becomes a rectangular wave, however, since a first order integration of the rectangular wave is performed by the capacitor 132 in the filter 130, a wave form of the node 133 becomes a triangular wave. A comparison between the triangular wave of the node 133 fed back through the feedback resistor 140 and the input audio signal AIN is made in the operational amplifier 110. As a result of this, the PWM pulse train modulated by the pulse width modulation by the input audio signal AIN is outputted from the operational amplifier 110, and the modulated PWM pulse train is outputted to the filter 130 through the output stage 120. The PWM pulse train is supplied to the speaker unit SP in a state in which the components in the high frequency range are removed by passing through the filter 130.

Specifically, in a case where the voltage of the input audio signal AIN is 0V, the PWM pulse train whose duty ratio is 50% is inputted from the output stage 120, and in this case the voltage applied to the speaker unit SP becomes 0V. Moreover, when the voltage of the input audio signal AIN increases from 0V to a positive voltage, the duty ratio of the PWM pulse train outputted from the output stage 120 changes from 50% to a maximum of 100%, and the voltage applied to the speaker unit SP changes from 0V to a maximum of +B. On the other hand, when the voltage of the input audio signal AIN changes from 0V to a negative voltage, the duty ratio of the PWM pulse train outputted from the output stage 120 changes from 50% to a minimum of 0%, and the voltage applied to the speaker unit SP changes from 0V to a minimum of −B. Thus, the signal having a wave form similar to the wave form of the input audio signal AIN is given to the speaker unit SP.

While amplifying operation is performed by the above described class-D amplifying portion 100, the current feedback circuit 200 feeds the load current flowing to the speaker unit SP back to the operational amplifier 110 as the input portion of the class-D amplifying portion 100, and the filter current feedback circuit 300 feeds the filter current flowing to the filter 130 back to the same operational amplifier 110. As a result, the following effects are obtained.

The impedance of the speaker unit SP changes in accordance with the driving frequency of the speaker unit SP. Here, when the impedance of the speaker unit SP increases and the load current flowing to the speaker unit SP decrease in accordance with the change of the driving frequency of the speaker unit SP, the feedback signal fed back to the input portion of the class-D amplifying portion 100 via the current feedback circuit 200 decreases and the output signal of the class-D amplifying portion 100 increases. As a result of this, an effective voltage applied from the class-D amplifying portion 100 to the speaker unit SP increases and the load current flowing to the speaker unit SP is increased. On the other hand, when the impedance of the speaker unit SP decreases and the load current flowing to the speaker unit SP increases in accordance with the change of the driving frequency of the speaker unit SP, the feedback signal fed back to the input portion of the class-D amplifying portion 100 via the current feedback circuit 200 increases and the output signal of the Class-D amplifying portion 100 decreases. As a result of this, the effective voltage applied from the class-D amplifying portion 100 to the speaker unit SP decreases and the load current flowing to the speaker unit SP is decreased. As a result of the above described negative feedback control of the load current, the load current flowing to the speaker unit SP approaches a constant value which is a value irrespective of the driving frequency of the speaker unit SP.

Thus, in the present embodiment, in the case where the output impedance of the class-D amplifying portion 100 is increased by feeding the load current flowing to the speaker unit SP back to the input portion of the Class-D amplifying portion 100, it is possible to allow the load current flowing to the speaker unit SP from the class-D amplifying portion 100 to approach the constant value by increasing the output impedance of the class-D amplifying portion 100. Accordingly, it is possible to achieve emitting sound at high volume levels by flowing the sufficient load current to the speaker unit SP in the low frequency range around the lowest resonant frequency F0 at which the impedance of the speaker unit SP increases. Moreover, since the control that controls the load current flowing to the speaker unit SP to approach the constant value irrespective of the driving frequency of the speaker unit SP is executed in the present embodiment, it is possible to prevent the speaker unit SP from being damaged by preventing flow of an excessive large current to the speaker unit SP at any frequency bands other than the low frequency range around the lowest resonant frequency F0. Moreover, since the speaker unit with the low resistance Rsp is used in the present embodiment, generation of heat of the voice coil when emitting sound at the same sound pressure is decreased, and it is possible to reduce the electric power consumption of the acoustic apparatus.

Moreover, in the present embodiment, where v represents a change amount of a voltage supplied to the speaker unit SP as a load and i represents a change amount of a load current flowing to the speaker unit SP in a case where the resistance Rsp of the speaker unit SP changed, the output resistance Ramp of the output stage 120 is given by the equation v/i. In the present embodiment, the current feedback circuit 200 adjusts, by means of the current feedback, the output resistance Ramp (output impedance) of the output stage 120 to an appropriate value such that the Q factor of the acoustic apparatus 10 falls within the ordinary Q factor range. More specifically, the feedback amount of the load current in the current feedback circuit 200 is adjusted such that the output resistance Ramp of the output stage 120, which is obtained by the equation v/i, becomes the appropriate value, and the Q factor of the acoustic apparatus is increased to the value within the ordinary Q factor range at the lowest resonant frequency F0 of the speaker system SS.

Figure 3:
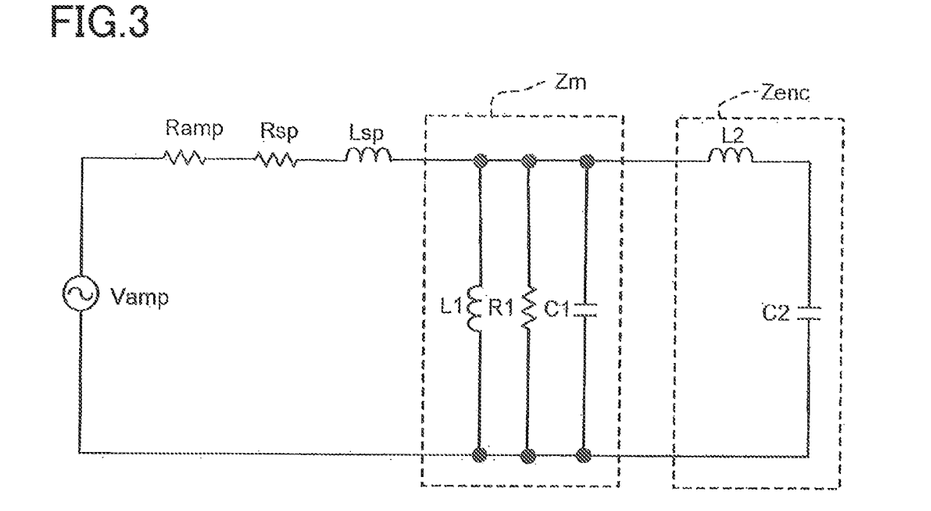
FIG. 3 is a schematic circuit diagram illustrating a configuration of an equivalent circuit of the acoustic apparatus.

Next, there will be described the effects of the present embodiment with reference to FIG. 3. FIG. 3 is a schematic circuit diagram illustrating a configuration of an equivalent circuit of the acoustic apparatus 10 including the speaker system SS. In FIG. 3, an inductor L1, a resistor R1 and a capacitor C1 are disposed and connected in parallel, and constitute a motional impedance Zm of the speaker unit SP. Moreover, an inductor L2 and a capacitor C2 constitute an impedance Zenc of an enclosure in which the speaker unit SP is provided. In an equivalent circuit of the acoustic apparatus 10, an inductor Lsp, a resistor Rsp and a resistor Ramp are connected in series to a circuit in which the motional impedance Zm and the impedance Zenc of the enclosure are connected in parallel.

Here, the inductor Lsp is an inductor of the voice coil of the speaker unit SP. Moreover, the resistor Rsp is a resistance of the same voice coil. And, the resistance Ramp is the output resistance (output impedance) of the class-D amplifying portion 100. Driving voltage Vamp generated by the class-D amplifier 1 is applied to the parallel circuit in which the motional impedance Zm and the impedance Zenc via the resistance Ramp, the resistance Rsp and the inductor Lsp.

As shown in the equation (3), by increasing the output resistance Ramp of the class-D amplifying portion 100, it is possible to increase the Q factor of the acoustic apparatus 10. Here, if an ordinary analogue amplifier is used as the amplifier of the acoustic apparatus, it is possible to increase the Q factor by increasing the output resistance of the analogue amplifier. In this case, however, the electric power consumption of the analogue amplifier increases accordingly. In the present embodiment, an actual entity that drives the speaker unit SP is the Class-D amplifying portion 100. Since the state of the output stage 120 of the class-D amplifying portion 100 is in any one of (a) a state in which one of the transistors 121 and 122 is in On and the other of which is in OFF, and (b) a state in which one of the transistors 121 and 122 is in OFF and the other of which is in ON, the electric power consumption is hardly increased by increasing the output resistance. More specifically, the electric power consumption is hardly increased even if the output resistance Ramp of the output stage 120 is changed to the resistance value such that the Q factor falls within the ordinary Q factor range by means of the current feedback by the current feedback circuit 200 in the class-D amplifying portion 100. According to the present embodiment, it is possible to increase the Q factor to the value within the ordinary Q factor range and improve the efficiency η of the acoustic apparatus 10 over the whole frequency range without increasing the electric power consumption of the class-D amplifying portion 100.

In an experiment of the present embodiment, the speaker unit SP with high force factor BL is manufactured as follows. An ordinary speaker unit SPo having an ordinary Q factor and a predetermined resistance Rspo is prepared and the voice coil of the ordinary speaker unit which is originally wounded with an original wire is rewound with another wire having lower resistance per unit length than the original wire to obtain the speaker unit SP having a lower resistance Rspx than the resistance Rspo. The predetermined resistance Rspo is 4 ohms and the resistance Rspx is 2 ohms, for example. In an acoustic apparatus including the speaker system with the speaker unit SP and an ordinary amplifier, the efficiency η is improved, however, the Q factor decreases to a value lower than 0.2 and the sound pressure in low frequency range is insufficient compared to mid-high frequency range. In the acoustic apparatus 10 with the class-D amplifier 1, the Q factor of the acoustic apparatus 10 is increased to a value larger than 0.2 by adjusting the output resistance Ramp of the Class-D amplifying portion 100 to an appropriate value, such that the sum of the resistance Ramp and the resistance Rspx is approximately identical with the resistance Rspo. The appropriate value of the output resistance Ramp is 4 ohms, for example. As a result, the efficiency η is improved without causing insufficiency of the sound pressure.

Other Embodiment

Figure 4:
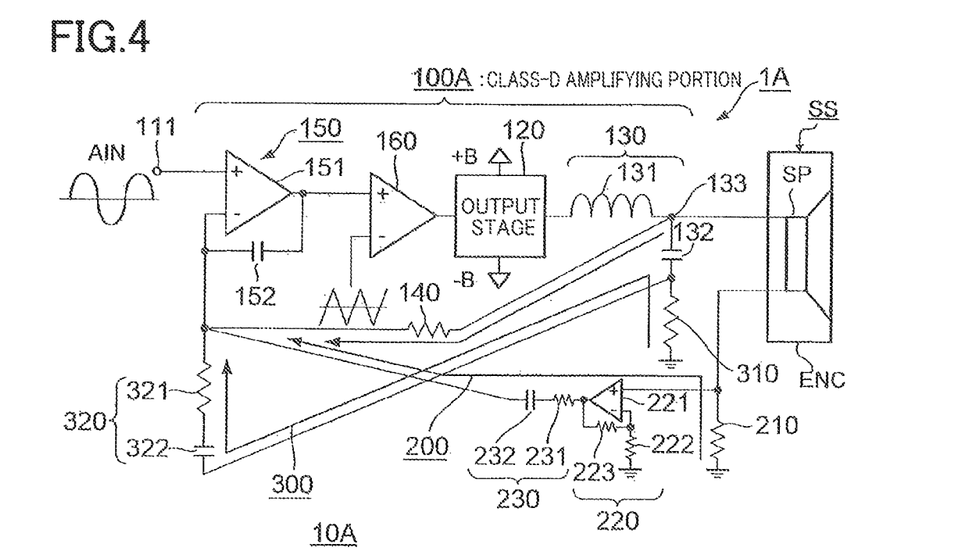
FIG. 4 is a schematic circuit diagram illustrating another embodiment of the acoustic apparatus.

As described above, the embodiment of the present disclosure is explained, however, the present disclosure can be applied to other embodiments. For example, in the above described embodiment, the class-D amplifying portion 100, which is a self-oscillating type amplifier, is connected to the speaker system SS, however, a non-self-oscillating class-D amplifier may be connected to the speaker system SS. The non-self-oscillating class-D amplifier doesn't self-oscillate and instead comprises a carrier signal generating circuit which generates a periodical carrier signal. FIG. 4 illustrates a configuration of an acoustic apparatus 10 as another embodiment of the present disclosure. It is noted that the same reference numerals as used in the above-illustrated FIG. 1 are used to designate the corresponding elements of said another embodiment, and an explanation of which is dispensed with.

In the acoustic apparatus 10A, the self-oscillating class-D amplifier 1 of the above described previous embodiment is replaced by a non-self-oscillating class-D amplifier 1A. In a class-D amplifying portion 100A of the class-D amplifier 1A, the operational amplifier 110 of the above described class-D amplifying portion 100 is replaced by an error integrator 150 and a comparator 160.

The error integrator 150 is constituted by an operational amplifier 151 and an integrating capacitor 152 disposed between an output terminal of the operational amplifier 151 and an inverting input terminal of the operation amplifier 151. The input audio signal AIN is inputted to a non-inverting input terminal of the operational amplifier 151 from the input terminal 111. Moreover, the output voltage from the speaker unit SP is fed back to the inverting input terminal of the operational amplifier 151 via the feedback resistor 140, the load current flowing to the speaker unit SP is fed back to the inverting input terminal of the operational amplifier 151 via the current feedback circuit 200, and the current flowing to the filter 130 is fed back to the inverting input terminal of the operational amplifier 151 via the filter current feedback circuit 300. The error integrator 150 integrates an error between the input audio signal AIN and a feedback signal fed back via each of the feedback circuits, and outputs an integrated signal indicating a value of the integration as an integration value signal.

The periodical carrier signal with a frequency sufficiently higher than the frequency band of the input audio signal AIN are given to the inverting input terminal of the comparator 160 from the carrier signal generating circuit, which is not illustrated. In the illustrated example, the periodical carrier signal is a triangular wave signal, however, a sawtooth waveform signal may be used as the periodical carrier signal. The comparator 160 outputs, to the output stage 120, the PWM pulse train which is modulated by pulse width modulation by the value of the integration signal outputted from the error integrator 150 based on comparing between the integration value signal and the periodical carrier signal. Functions of the output stage 120 and the filter 130 are the same as those of the above described embodiment.

Also in the acoustic apparatus 10A, it is possible to obtain the same effects as those of the above described embodiment. Furthermore, in the non-self-oscillating class-D amplifier 1A, since an oscillation frequency of the non-self-oscillating class-D amplifier 1A is determined in the carrier signal generating circuit, the negative feedback of the filter current may be removed by lowering the resistance of the current sensing resistor 310 to zero. The filter current feedback circuit 300 is unnecessary for the non-self-oscillating class-D amplifier 1A.

What is claimed is:

1. An acoustic apparatus, comprising:
    a class-D amplifier including a current feedback circuit; and
    a speaker system including a voice coil driven by the class-D amplifier,
    wherein
    the speaker system is configured such that, in a case where the speaker system is driven by an ordinary amplifier having a first output resistance lower than a second output impedance of the class-D amplifier, a Q factor of the speaker system falls below a predetermined lower limit of an ordinary Q factor range of an ordinary speaker system,
    the current feedback circuit is configured to increase the second output impedance of the class-D amplifier by feeding a current flowing to the voice coil back to an input of the class-D amplifier so as to increase a Q factor as the acoustic apparatus higher than the predetermined lower limit of the ordinary Q factor range and within the ordinary Q factor range,
    the voice coil of the speaker system is wound with a first wire having a first resistance per unit length less than a second resistance per unit length of a second wire with which a voice coil of the ordinary speaker system having a Q factor within the ordinary Q factor range is wound, and electric power consumption of the acoustic apparatus when emitting sound at a first sound pressure is less than that of an ordinary acoustic apparatus including the ordinary speaker system and the ordinary amplifier when emitting at the same first sound pressure.

2. The acoustic apparatus according to claim 1, wherein the speaker system is configured to such that, in the case where the speaker system is driven by the first amplifier, the Q factor of the speaker system falling below the predetermined lower limit of the ordinary Q factor range causes a decrease of sound pressure around a lowest resonant frequency of the speaker system, and
    the acoustic apparatus is configured to supplement the decrease of the sound pressure around the lowest resonant frequency by increased the Q factor within the ordinary Q factor range in a case where the speaker system is driven by the class-D amplifier.

3. The acoustic apparatus according to claim 1, wherein the predetermined lower limit of the ordinary Q factor range is 0.2.

4. The acoustic apparatus according to claim 1, wherein the current feedback circuit increases the second output resistance to a predetermined value between 1 ohm and 10 ohm.

5. A design method for an acoustic apparatus, the acoustic apparatus comprising:
    a class-D amplifier including a current feedback circuit; and
    a speaker system including a voice coil driven by the class-D amplifier, the design method comprising:
    a design process of designing the speaker system such that, in a case where the speaker system is driven by an ordinary amplifier having a first output resistance lower than a second output impedance of the class-D amplifier, a Q factor of the speaker system falls below a predetermined lower limit of an ordinary Q factor range of an ordinary speaker system; and
    a second design process of designing the second output impedance of the class-D amplifier of the speaker system such that a Q factor as the acoustic apparatus falls higher than the predetermined lower limit of the ordinary Q factor range and within the ordinary Q factor range by controlling a feedback amount of the current feedback circuit to increase the second output impedance of the class-D amplifier by feeding a current flowing to the voice coil back to an input of the class-D amplifier.

6. The design method according to claim 5, wherein the speaker system is configured to such that, in the case where the speaker system is driven by the first amplifier, the Q factor of the speaker system falling below the predetermined lower limit of the ordinary Q factor range causes a decrease of sound pressure around a lowest resonant frequency of the speaker system, and
    the acoustic apparatus is configured to supplement the decrease of the sound pressure around the lowest resonant frequency by increasing the Q factor within the ordinary Q factor range in a case where the speaker system is driven by the class-D amplifier.

7. The design method according to claim 5, wherein the voice coil of the speaker system is wound with a first wire having a first resistance per unit length less than a second resistance per unit length of a second wire with which a voice coil of the ordinary speaker system having a Q factor within the ordinary Q factor range is wound, and electric power consumption of the acoustic apparatus when emitting sound at a first sound pressure is less than that of an ordinary acoustic apparatus including the ordinary speaker system and the ordinary amplifier when emitting at the same first sound pressure.

8. The design method according to claim 5, wherein the predetermined lower limit of the ordinary Q factor range is 0.2.

9. The design method according to claim 5, wherein the current feedback circuit increases the second output resistance to a predetermined value between 1 ohm and 10 ohm.

* * * * *